US006977126B2

(12) United States Patent
Shirasaki

(10) Patent No.: US 6,977,126 B2
(45) Date of Patent: Dec. 20, 2005

(54) PELLICLE, PHOTOMASK, PELLICLE FRAME, AND METHOD FOR MANUFACTURING PELLICLE

(75) Inventor: Toru Shirasaki, Gunma-ken (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 57 days.

(21) Appl. No.: 10/016,628

(22) Filed: Dec. 17, 2001

(65) Prior Publication Data

US 2002/0090558 A1   Jul. 11, 2002

(30) Foreign Application Priority Data

Dec. 18, 2000  (JP) .............................. 2000-383205

(51) Int. Cl.⁷ .............................. G03F 9/00; G03F 7/00
(52) U.S. Cl. .............................. 430/5; 430/311; 428/14
(58) Field of Search .............................. 430/5, 30, 311; 428/14, 194

(56) References Cited

U.S. PATENT DOCUMENTS

| 4,861,402 A | 8/1989 | Gordon | 156/108 |
|---|---|---|---|
| 6,083,577 A * | 7/2000 | Nakagawa et al. | 428/14 |

FOREIGN PATENT DOCUMENTS

| JP | 58-219023 | | 12/1983 | | |
|---|---|---|---|---|---|
| JP | 63-27707 | | 6/1988 | | |
| JP | 7-168345 | | 7/1995 | | |
| JP | 09-206723 | * | 8/1997 | ........... | B08B 17/00 |
| JP | 09-319069 | * | 12/1997 | ............ | G03F 1/14 |
| JP | 10-020480 | * | 1/1998 | ............ | G03F 1/14 |
| JP | 2000-122266 | * | 4/2000 | ............ | G03F 1/14 |
| JP | 2000-194121 | * | 7/2000 | ............ | G03F 1/14 |

* cited by examiner

Primary Examiner—Nicole Barreca
(74) Attorney, Agent, or Firm—McGinn IP Law Group, PLLC

(57) ABSTRACT

A pellicle for protecting a reticle, on which a circuit pattern is formed for manufacturing a semiconductor device, from an attachment of a foreign matter, comprising: a pellicle film having a predetermined thickness, through which a light transmits to the reticle; and a pellicle frame, on which a periphery of the pellicle film contacts, including: a body part having a frame shape, the height of which is substantially constant all over the body part; and an upper protruding part formed on an upper end of the body part that protrudes upward from the upper end of the body part for directly contacting with a surface of the pellicle film, the height of the upper protruding part being constant all over the upper protruding part.

29 Claims, 8 Drawing Sheets

PELLICLE, PHOTOMASK, PELLICLE FRAME, AND METHOD FOR MANUFACTURING PELLICLE

This patent application claims priority from a Japanese patent application No. 2000-383205 filed on Dec. 18, 2000, the contents of which are incorporated herein by reference.

BACKGROUND OF THE INVENTION

1. Field of the Invention

The present invention relates to a pellicle, a photomask, a pellicle frame, and a method for manufacturing a pellicle. More particularly, the present invention relates to a pellicle, which is used for protecting a reticle from attachment of a foreign matter. A reticle is used for a lithography process for manufacturing a semiconductor device such as an LSI (Large-Scale Integrated) circuit, a VLSI (Very Large-Scale Integrated) circuit, or an LCD (Liquid Crystal Display).

2. Description of the Related Art

To manufacture a semiconductor device such as an LSI circuit, a VLSI circuit, or an LCD by a lithography process, a light is irradiated to a semiconductor wafer through a reticle, on which a circuit pattern to be transcribed onto the wafer is formed. A reticle is a photomask used for a stepper. If foreign matter is attached to the reticle, this foreign matter absorbs or reflects the light, and thus the pattern transcribed onto the wafer may deform. Also, the shape of the edge of the pattern may deform. Therefore, the size, the quality, and the outward appearance of the pattern transcribed on the wafer deteriorate. Thus, the performance or the yield factor of a semiconductor device and LCD manufactured from this wafer decrease.

Because of the above-mentioned reason, the lithography process described-above is performed inside a clean room. However, even inside the clean room, it is difficult to always maintain the reticle in a normal condition, that is, the condition where the reticle is free from attachment of foreign matter. Thus, usually, a pellicle that protects the reticle from foreign matter is adhered to the surface of the reticle. A pellicle is transparent so that a light used for exposure can transmit through the pellicle onto the reticle.

By using a pellicle, the foreign matter does not attach to the surface of the reticle but attaches to the surface of the pellicle. Therefore, if the light is focused on the pattern of the reticle during the lithography process, the foreign matter, which attaches to the pellicle, does not influence the transcription of the pattern onto the wafer.

FIG. 1 shows a configuration of a conventional photomask. The photomask has a reticle 14 and a pellicle 100. The pellicle 100 includes a pellicle film 12 and a pellicle frame 10.

The pellicle 100 is manufactured by applying a good solvent of the pellicle film 12 on the top end face of a pellicle frame 10, drying the solvent on the pellicle frame 10 with wind, and adhering the pellicle frame 10 on the transparent pellicle film 12 as disclosed in Japanese Patent Application Laid-Open No. S58-219023. The pellicle frame 10 is made from material such as nitrocellulose, cellulose acetate, or fluoroplastics, which has high optical permeability. The pellicle frame 10 can be made from material such as aluminum, stainless steel, or polyethylene, as examples.

The pellicle 100 can also be manufactured by adhering the pellicle frame 10 on a pellicle film 12 with adhesive 20 as disclosed in U.S. Pat. No. 4,861,402, Japanese Patent Application publication No. S63-27707, and Japanese Patent Application Laid-Open No. H7-168345. Acrylic resin, epoxy resin, or fluoroplastics can be used as adhesive 20. Also, an adhesive layer 22 and a separation layer for protecting the adhesive layer 22 is further adhered on a bottom end face of the pellicle frame 10. An adhesive layer is made from material such as polybutene resin, polyvinyl acetate resin, acrylic resin, or silicon resin. Therefore, the pellicle film 12 is adhered to the pellicle frame 10 via the adhesive 20. Then, the photomask 200 is manufactured by adhering the pellicle 100 on the reticle 14 with the adhesive 22.

Recently, the requirement for the resolution of the lithography has gradually increased. Therefore, a light having a shorter wavelength is gradually used to satisfy the requirement of the resolution. Specifically, instead of an ultraviolet light of g-line having 436 nm wavelength or i-line having 365 nm wavelengths, an extreme ultraviolet light of KrF excimer laser has been used recently. In the near future, a vacuum ultraviolet light such as an ArF excimer laser having 193 nm wavelength or an F2 excimer laser having 158 nm wavelengths will be used.

If the wavelength of the light becomes shorter, the photon energy of light becomes large. Thus, the deterioration of the material used for the lithography process becomes large. Especially, in a case of the pellicle film 12, because the material used for the pellicle film 12 is organic material such as fluoroplastics, the pellicle film 12 tends to deteriorate easily when using the light having a shorter wavelength.

Therefore, it is proposed to use an inorganic material for a material of a pellicle film 12. In a case of using an inorganic material for the pellicle film 12, the pellicle film 12 should have a larger thickness than the pellicle film 12 made of organic material in order to have enough strength because the inorganic compound layer is generally weak. However, if the thickness of the pellicle film 12, which is made of inorganic material, is large, it becomes very important that the surface of the pellicle film 12 and the surface of the reticle 14 are accurately parallel to each other because of the optical restriction inside the stepper.

Therefore, comparing the relationship between the surface of the pellicle film 12 made of organic material and the surface of the reticle 14, the surface of the pellicle film 12 made of inorganic material and the surface of the reticle 14 should be more accurately parallel.

If the pellicle film 12 is adhered to the pellicle frame 10 through the adhesive 20 as shown in FIG. 1, it is difficult to make the surface of the pellicle film 12 be accurately parallel to the surface of the reticle 14 because the thickness of the adhesive 20 is not uniform.

Generally, the pellicle 100 is adhered to the reticle 14 through the adhesive 22, which is applied on the bottom end of pellicle frame 10. By pressing and adhering the bottom end face of the pellicle frame 10 to the reticle 14, the adhesive layer protected by the separation layer of the adhesive 22 is collapsed, and the pellicle 100 thus be adhered to the reticle 14.

Because this adhesive 22 has elasticity, the distance between the bottom surface of the pellicle film 12 and the top surface of the reticle 22 changes according to the pressure applied on the pellicle 100 against the reticle 14. If the distribution of weight applied on the pellicle 100 is different in each location inside the surface of the pellicle 100, to which the reticle 14 is adhered, the height of the adhesive 22 becomes different for each location. Therefore, the surface of the pellicle film 12 and the surface of the reticle 14 do not become parallel to each other.

SUMMARY OF THE INVENTION

Therefore, it is an object of the present invention to provide a pellicle, which is capable of overcoming the above drawbacks accompanying the conventional art. The above and other objects can be achieved by combinations described in the independent claims. The dependent claims define further advantageous and exemplary combinations of the present invention.

According to the first aspect of the present invention, a pellicle for protecting a reticle, on which a circuit pattern is formed for manufacturing a semiconductor device, from an attachment of a foreign matter, comprises: a pellicle film having a predetermined thickness, through which a light transmits to the reticle; and a pellicle frame, on which a periphery of the pellicle film contacts, including: a body part having a frame shape, the height which are substantially constant all over the body part; and an upper protruding part formed on an upper end of the body part that protrudes upward from the upper end of the body part for directly contacting with a surface of the pellicle film, the height of the upper protruding part being constant all over the upper protruding part.

The upper protruding part may be formed on an inner edge of the upper end of the body part. The upper protruding part may be formed on an outer edge of the upper end of the body part. The upper protruding parts may be formed on both an inner edge and an outer edge of the upper end of the body part so that a recessed part is formed between the upper protruding parts.

The pellicle may further comprise a lower protruding part formed on a lower end of the body part that protrudes downward from the lower end of the body part for directly contacting with a surface of the reticle, the height of the lower protruding part being constant all over the lower protruding part. The lower protruding part may be formed on an inner edge of the lower end of the body part. The lower protruding part may be formed on an outer edge of the lower end of the body part.

The lower protruding parts may be formed on both an inner edge and an outer edge of the lower end of the body part so that a recessed part is formed between the lower protruding parts. The pellicle film and the pellicle frame may be adhered such that the upper protruding part directly contacts a surface of the pellicle film, and an upper end of the body part contacts the surface of the pellicle film through an adhesive.

The pellicle frame and the reticle may be adhered such that the lower protruding part directly contacts a surface of the reticle, and a lower end of the body part contacts the surface of the reticle through an adhesive.

A top end of the upper protruding part may have a sharp edge so that the upper protruding part is contacting the pellicle film at one point along a cross sectional direction perpendicular to a longitudinal direction of the upper protruding part. Furthermore, a bottom end of the lower protruding part may have a sharp edge so that the lower protruding part contacts the reticle at one point along a cross sectional direction perpendicular to a longitudinal direction of the lower protruding part.

According to the second aspect of the present invention, a photomask comprises: a reticle, on which a circuit pattern is formed for manufacturing a semiconductor device; and a pellicle for protecting the reticle from an attachment of a foreign matter; wherein the pellicle has a pellicle film having a predetermined thickness, through which a light transmits to the reticle; and a pellicle frame, on which a periphery of the pellicle frame contacts, including: a body part having a frame shape, the height of which are substantially constant all over the body part; and an upper protruding part formed on an upper end of the body part that protrudes upward from the upper end of the body part for directly contacting with a surface of the pellicle film, the height of the upper protruding part being constant all over the upper protruding part.

The photomask may further comprise a lower protruding part formed on a lower end of the body part that protrudes downward from the lower end of the body part for directly contacting with a surface of the reticle, the height of the lower protruding part being constant all over the lower protruding part.

The upper protruding part may be formed on an inner edge of the upper end of the body part, and the lower protruding part is formed on an inner edge of the lower end of the body part. The upper protruding part may be formed on an outer edge of the upper end of the body part, and the lower protruding part may be formed on an outer edge of the lower end of the body part.

The upper protruding part may be formed on both an inner edge and an outer edge of the upper end of the body part so that an upper recessed part is formed between the upper protruding parts; and the lower protruding part may be formed on both an inner edge and an outer edge of the lower end of the body part so that a lower recessed part is formed between the lower protruding parts.

According to the third aspect of the present invention, a pellicle frame arranged between a reticle, on which a circuit pattern is formed for manufacturing a semiconductor device, and a pellicle film, through which a light transmits to the reticle, comprises: a first portion directly contacting the pellicle film; and a second portion contacting the pellicle film through an adhesive that adheres the pellicle frame to the pellicle film.

The first portion may directly contact the reticle, and the second portion contacting the reticle through an adhesive that adheres the pellicle frame to the reticle. A difference of height between the first portion and the second portion may serve as an adhesive accommodation part for accommodating the adhesive.

The summary of the invention does not necessarily describe all necessary features of the present invention. The present invention may also be a sub-combination of the features described above. The above and other features and advantages of the present invention will become more apparent from the following description of the embodiments taken in conjunction with the accompanying drawings.

DETAILED DESCRIPTION OF THE INVENTION

The invention will now be described based on the preferred embodiments, which do not intend to limit the scope of the present invention, but exemplify the invention. All of the features and the combinations thereof described in the embodiments are not necessarily essential to the invention.

Figure 2A:
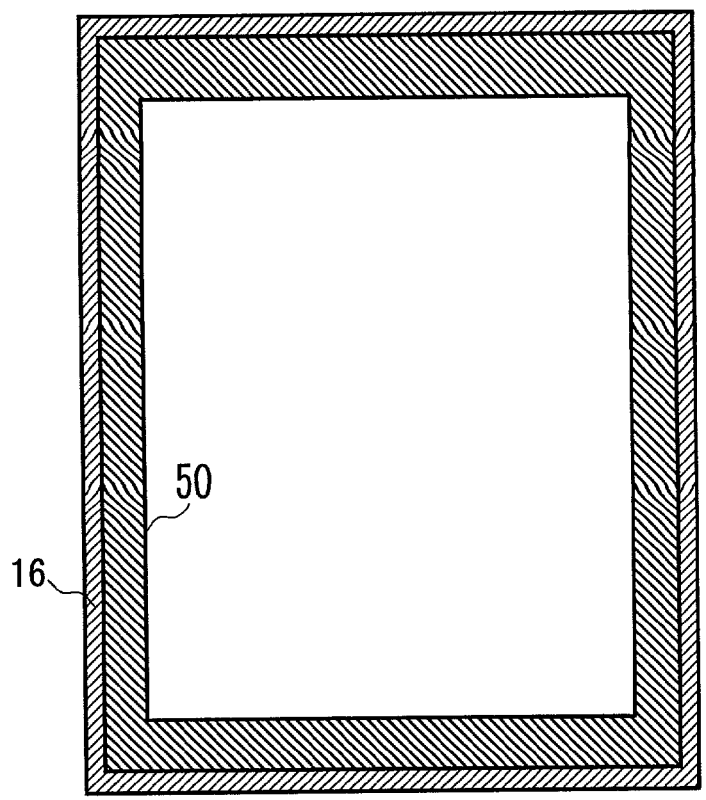
FIGS. 2A and 2B show configuration of a pellicle frame 10A of the present embodiment.
Figure 2B:
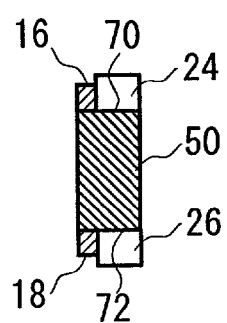

FIGS. 2A and 2B show configuration of a pellicle frame 10A of the present embodiment. FIG. 2A shows an upper plan view of the pellicle frame 10A. FIG. 2B shows a cross-sectional view of the pellicle frame 10A.

Figure 11A:
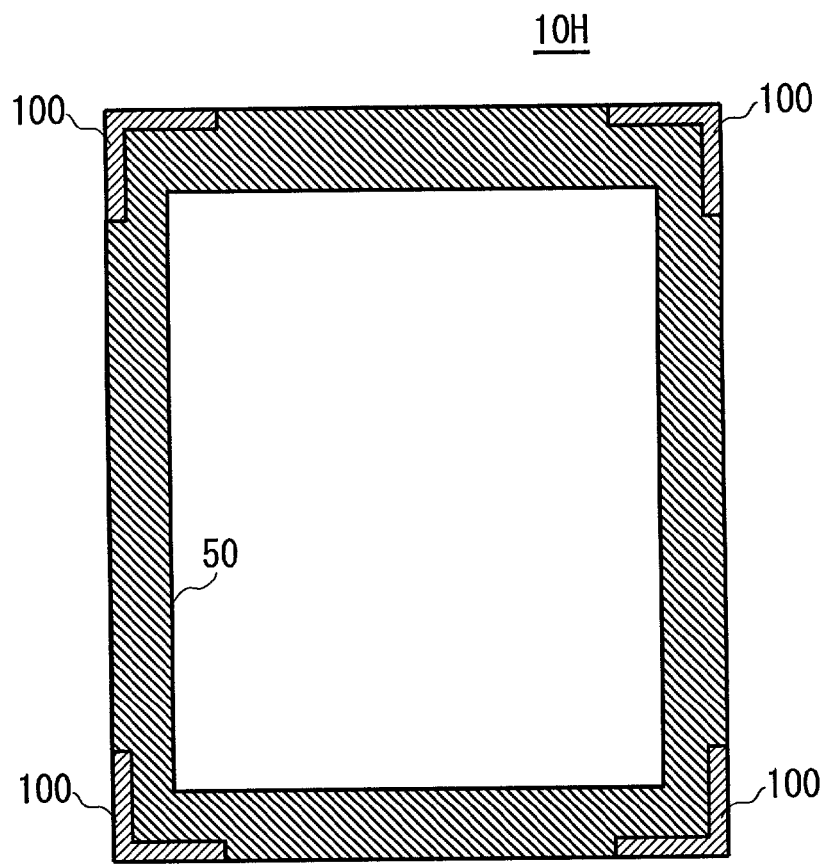
FIGS. 11A and 11B show configuration of another embodiment of the pellicle of the present invention.

A pellicle frame 10A has a body part 50 having a rectangular frame shape and an upper protruding part 16 formed all around an outer edge of the upper end 70 of the body part 50. The shape of the pellicle frame 10A can be various shapes other than rectangular shape such as circular shape or octagonal shape. Furthermore, the upper protruding part 16 is not necessarily formed all around the upper end 70 of the body part 50. The upper protruding part can be formed on a part of the upper end 70 of the body part 50 as shown in FIG. 11A.

The body part 50 and the upper protruding part 16 are integrally formed. The height of the body part 50 is substantially constant all over the body part 50. The upper protruding part 16 protrudes upward from the upper end 70 of the body part. The height of the upper protruding part 16 is constant all over the upper protruding part 16.

A pellicle frame 10A further has a lower protruding part 18 formed all around an outer edge of the lower end 72 of the body part 50. The lower protruding part 18 is not necessarily formed all around the lower end 72 of the body part 50. The lower protruding part can be formed on a part of the lower end 72 of the body part 50. The lower protruding part 18 protrudes downward from the lower end 72 of the body part 50. The body part 50 and the lower protruding part 18 are integrally formed. The height of the lower protruding part 18 is constant all over the lower protruding part 18. A pellicle frame 10A is formed by such as a rigid material such as metal, glass, ceramic, or plastic, which are conventionally known.

As shown in FIG. 2B, an adhesive 24 is applied on the upper end 70 of the body part 50. Here, the adhesive 24 is not applied on the top end of the upper protruding part 16 as shown in FIG. 2B. Preferably, the adhesive 24 is applied on the upper end 70 of the body part 50 such that the height of the adhesive 24 is slightly higher than the height of the upper protruding part 16. A material such as acrylic resin, epoxy resin, fluoroplastics, polybutene resin, polyvinyl acetate resin, or silicon resin, which are conventionally known, can be used for the adhesive 24.

Furthermore, an adhesive 26 is applied on the lower end 72 of the body part 50 as shown in FIG. 2B. Here, the adhesive 26 is not applied on the bottom end of the lower protruding part 18. Preferably, the adhesive 26 is applied on the lower end 72 of the body part 50 such that the height of the adhesive 26 is slightly higher than the height of the lower protruding part 18. A material such as polybutene resin, polyvinyl acetate resin, acrylic resin, or silicon resin, which are conventionally known, can be used for the adhesive 26.

Figure 3:
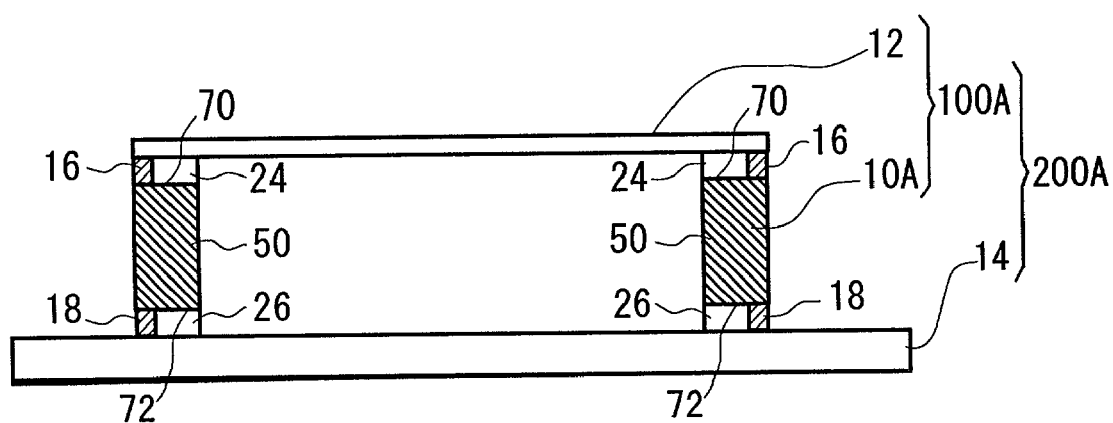
FIG. 3 shows a configuration of a photomask manufactured using the pellicle frame 10A shown in FIGS. 2A and 2B.

FIG. 3 shows a configuration of a photomask manufactured using the pellicle frame 10A shown in FIG. 2A and 2B. A photomask 200A has a pellicle film 12, a pellicle frame 10A, and a reticle 14. The pellicle film 12 is transparent so that a light can transmit through the pellicle frame 12 onto the reticle 14. The pellicle film 12 has a predetermined thickness in order to have enough strength.

The pellicle film 12 is made from an inorganic compound. As an example of the inorganic compound, there are materials such as silica glass, calcium fluoride, and magnesium fluoride, which are excellent in extreme ultraviolet radiation permeability. A silica glass is the most preferable material to be used for the pellicle film 12. A circuit pattern is formed on the reticle 14 so that a light that passes through the reticle 14 is irradiated onto the wafer to manufacture a semiconductor device. A conventional reticle may be used for the reticle 14 of the present embodiment.

The pellicle frame 10A is adhered to the pellicle film 12 by the adhesive 24 to form a pellicle 10A. The pellicle film 12 and the pellicle frame 10A are adhered such that the upper protruding part 16 of the pellicle frame 10A directly contacts a surface of the pellicle film 12. At this time, the periphery of the pellicle film 12 contacts the upper protruding part 16 of the pellicle frame 12. By the above-mentioned process, the pellicle 100A that protects the reticle 14 from a foreign matter can be manufactured.

Furthermore, the pellicle 100A and the reticle 14 is adhered by the adhesive 26 such that that the lower protruding part 18 of the pellicle 100A directly contacts a surface of the reticle 14. Then, the photomask 200A used for manufacturing a semiconductor device is manufactured.

The amount of adhesive 24 applied on the upper end 70 of the body part 50 is determined so that the upper protruding part 16 of the pellicle frame 10A directly contacts a surface of the pellicle film 12. Also, the amount of adhesive 26 applied on the lower end 72 of the body part 50 is determined such that the lower protruding part 18 of the pellicle 100A directly contacts a surface of the reticle 14. The amounts of adhesive 24 and 26 are adjusted according to the characteristic of the adhesive 24 and 26 such as viscosity, density, and curing speed of the adhesive 24 and 26.

Because the upper protruding part 16 of the pellicle frame 10A directly contacts a surface of the pellicle film 12, the distance between the pellicle film 12 and the pellicle frame 10A is constant all over the pellicle 10A. That is, the distance between the pellicle film 12 and the pellicle frame 10A is substantially zero all over the pellicle 10A. Furthermore, because the lower protruding part 18 of the pellicle 100A directly contacts a surface of the reticle 14, and because the height of the pellicle frame 10A is constant all over the pellicle frame 10A, the bottom surface of the pellicle film 12 of the pellicle 10A becomes parallel to the top surface of the reticle 14. In other words, the distance between the bottom surface of the pellicle film 12 and the top surface of the reticle 14 becomes constant all over the pellicle film 12.

Conventionally, the adhesives 20 and 22 adhere the pellicle frame 10 to the pellicle film 12 and the reticle 14 and also control the vertical position of the pellicle 100 against the reticle 14.

Contrary, in the present embodiment, the adhesives 24 and 26 only adhere the pellicle frame 10A to the pellicle film 12 and the reticle 14, respectively, in the pellicle 10A. Instead of adhesive 24 and 26, the upper protruding part 16 and the lower protruding part 18 of the pellicle frame 10A control the vertical position of the pellicle 100A against the reticle 14. Because the pellicle frame 10A is made of rigid material, the surface of the pellicle film 12 and the surface of the reticle 14 can be accurately parallel to each other if the height of the pellicle frame 10A is accurately constant all over the pellicle frame 10A.

Figure 4:
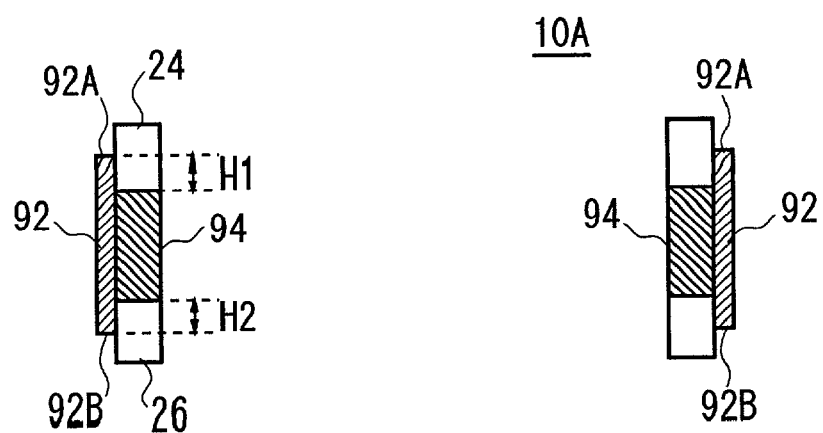
FIG. 4 shows another cross sectional view of the pellicle frame 10A.

FIG. 4 shows another cross sectional view of the pellicle frame 10A. The pellicle frame 10A shown in FIG. 4 is the same as that shown in FIG. 2B except the location of division between a body part and a protruding part.

In FIG. 2B, the pellicle frame 10A is divided in a horizontal direction for each of the upper protruding part 16, the body part, and the lower protruding part 18. In FIG. 4, the pellicle frame 10A is divided in a vertical direction.

The pellicle frame 10A has a first portion 92 that directly contacts the pellicle film 12 and a second portion 94 that contacts the pellicle film 12 through the adhesive 24. The first portion 92 contacts the pellicle film 12 such that the top end 92A of the first portion 92 directly contacts the pellicle film 12. Furthermore, the first portion 92 contacts the reticle 14 such that the bottom end 92B of the first portion 92 directly contacts the reticle 14. The second portion 92 contacts the reticle 14 through the adhesive 26.

The first portion 92 of FIG. 4 corresponds to the sum of the upper protruding part 16, a part of the body part 50, and the lower protruding part 18 shown in FIG. 2B. The second portion 94 of FIG. 4 corresponds to a part of the body part 50 shown in FIG. 2B.

A difference of height H1 and H2 between the first portion 92 and the second portion 94 serves as an adhesive accommodation part for accommodating the adhesives 24 and 26.

Figure 5A:
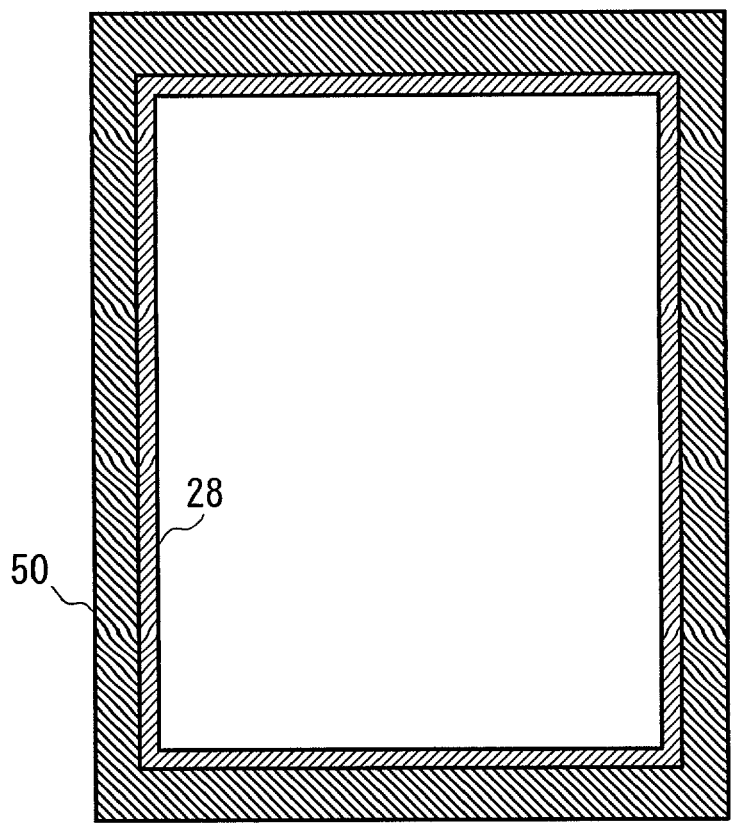
FIGS. 5A and 5B show configuration of another embodiment of the photomask of the present invention.
Figure 5B:
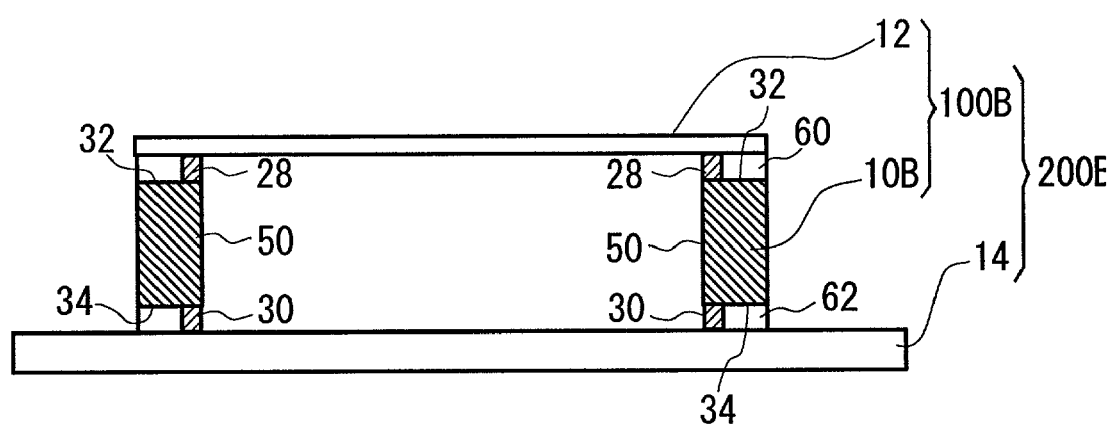

FIGS. 5A and 5B show configuration of another embodiment of the photomask of the present invention. The configuration of the photomask 2003 shown in FIGS. 5A and 5B are the same as the configuration of FIG. 3 except the position where the upper protruding part 28 and the lower protruding part 30 are formed.

The upper protruding part 28 shown in FIGS. 5A and 5B is formed all around the inner edge of the upper end 32 of the body part 50. The upper protruding part 28 is not necessarily formed all around the upper end 32 of the body part 50. The upper protruding part 28 can be formed on a part of the upper end 32 of the body part 50. Also, the lower protruding part 30 is formed all around the inner edge of the lower end 34 of the body part 50. The lower protruding part 30 is not necessarily formed all around the upper end 34 of the body part 50. The lower protruding part can be formed on a part of the lower end 34 of the body part 50. The upper protruding part 28, the body part 50, and the lower protruding part 30 are integrally formed.

Because the upper protruding part 28 of the pellicle frame 10B directly contacts a surface of the pellicle film 12, the vertical position of the surface of the pellicle film 12 against the pellicle frame 10B is constant all over the pellicle 10B. Furthermore, because the lower protruding part 30 of the pellicle 100B directly contacts a surface of the reticle 14, the bottom surface of the pellicle film 12 of the pellicle 10B becomes parallel to the top surface of the reticle 14. In other words, the distance between the bottom surface of the pellicle film 12 and the top surface of the reticle 14 becomes constant all over the pellicle film 12.

Figure 6A:
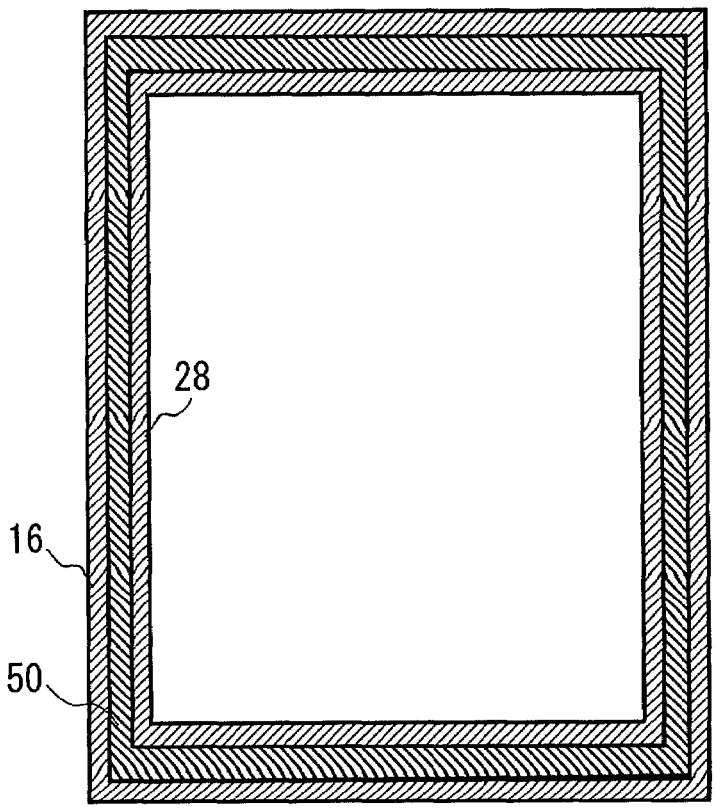
FIGS. 6A and 6B show further another embodiment of the photomask of the present invention.
Figure 6B:
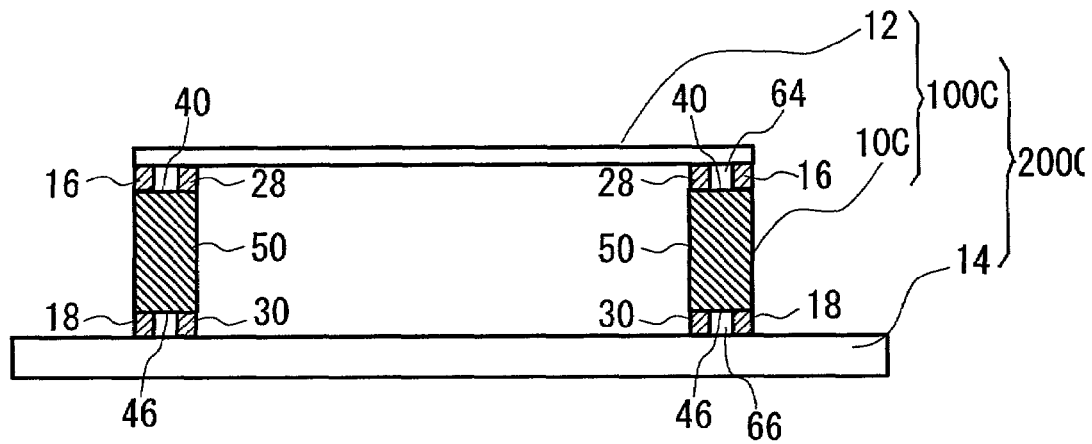

FIGS. 6A and 6B show further another embodiment of the photomask of the present invention. The configuration of the photomask 200C shown in FIGS. 6A and 6B are the same as the configuration of FIG. 3 except that two upper protruding parts 16 and 28 and two lower protruding parts 18 and 30 are formed.

The upper protruding parts 16 and 28 are formed all around both the inner edge and outer edge of the upper end 40 of the body part 50 so that an upper recessed part 40 is formed between the upper protruding parts 16 and 28. Furthermore, the lower protruding parts 18 and 30 are formed all around both the inner edge and outer edge of the lower end 46 of the body part 50 so that a lower recessed part 40 is formed between the lower protruding parts 18 and 30. The height of the upper protruding parts 16 and 28 are the same, and the height of the lower protruding parts 18 and 30 are the same.

The upper protruding parts 16 and 28 are not necessarily formed all around the upper end 40 of the body part 50. The upper protruding parts 16 and 28 can be formed on a part of the upper end 40 of the body part 50. Also, the lower protruding parts 18 and 30 are not necessarily formed all around the lower end 46 of the body part 50. The lower protruding parts 18 and 30 can be formed on a part of the lower end 46 of the body part 50.

Because the upper protruding parts 16 and 28 of the pellicle frame 10C directly contact a surface of the pellicle film 12, the vertical position of the pellicle film 12 against the pellicle frame 10C is constant all over the pellicle 10C. Furthermore, because the lower protruding parts 18 and 30 of the pellicle 100C directly contact a surface of the reticle 14, the bottom surface of the pellicle film 12 of the pellicle 10C becomes parallel to the top surface of the reticle 14. In other words, the distance between the bottom surface of the pellicle film 12 and the top surface of the reticle 14 becomes constant all over the region of the pellicle film 12.

Figure 7:
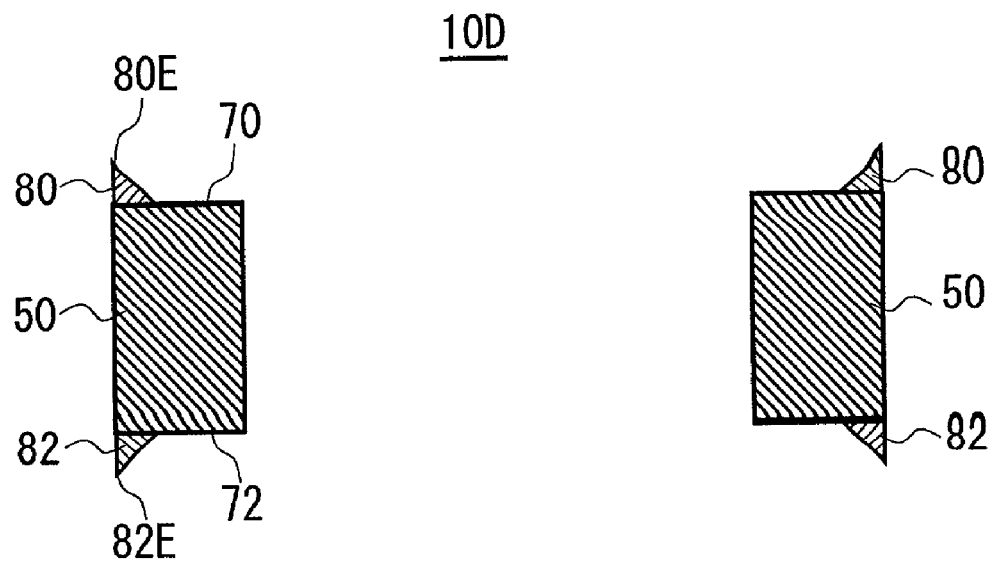
FIG. 7 shows another embodiment of the pellicle frame of the present invention.

FIG. 7 shows another embodiment of the pellicle frame of the present invention. The configuration of the pellicle frame 10D shown in FIG. 7 is the same as that shown in FIG. 2B except that a top end 80E of the upper protruding part 80 has a sharp edge. The upper protruding part 80 is formed all around an outer edge of the upper end 70 of the body part 50. Also, the lower protruding part 82 is formed all around an outer edge of the lower end 34 of the body part 50.

The upper protruding part 80 is not necessarily formed all around the upper end 70 of the body part 50. The upper protruding part can be formed on a part of the upper end 70 of the body part 50. Also, the lower protruding part 82 is not necessarily formed all around the lower end 34 of the body part 50. The lower protruding part 82 can be formed on a part of the lower end 34 of the body part 50.

Because the top end 80E of the upper protruding part 80 has a sharp edge, the upper protruding part 80 contacts the pellicle film 12 at one point, which is the top end 80E, along a cross sectional direction perpendicular to the longitudinal direction of the upper protruding part 80. If the top plan view of the connection between the pellicle frame 10D and the pellicle film 12 is shown, the shape of the connection is shown as a linear shape.

Thus, when the pellicle frame 10D is pushed and adhered to the pellicle film 12, the adhesive applied on the upper protruding part 80 escapes from the top end 80E of the upper protruding part 80. Therefore, the top end 80E of the upper protruding part 80 can directly and reliably contact a surface of the pellicle film 12. Thus, the vertical position of the pellicle film 12 against the pellicle frame 10D becomes constant all over the pellicle frame 10D because the pellicle frame 10D directly and reliably contacts the surface of the pellicle film 12 all over the pellicle frame 10D.

Furthermore, because the bottom end 82E of the lower protruding part 82 also has a sharp edge, the lower protruding part 82 contacts the reticle 14 at one point, which is the bottom end 82E, along a cross sectional direction perpendicular to the longitudinal direction of the lower protruding part 82. If the bottom plan view of the connection between the pellicle frame 10D and the reticle 14 is shown, the shape of the connection is shown as a linear shape.

Thus, when the pellicle frame 10D is pushed and adhered to the reticle 14, the adhesive applied on the lower protruding part 86 escapes from the bottom end 82E of the lower protruding part 82. Therefore, the bottom end 82E of the lower protruding part 82 can directly and reliably contact a surface of the reticle 14. Thus, the bottom surface of the pellicle film 12 becomes parallel to the top surface of the reticle 14. In other words, the distance between the bottom surface of the pellicle film 12 and the top surface of the reticle 14 becomes reliably constant all over the region of the pellicle film 12.

Figure 8:
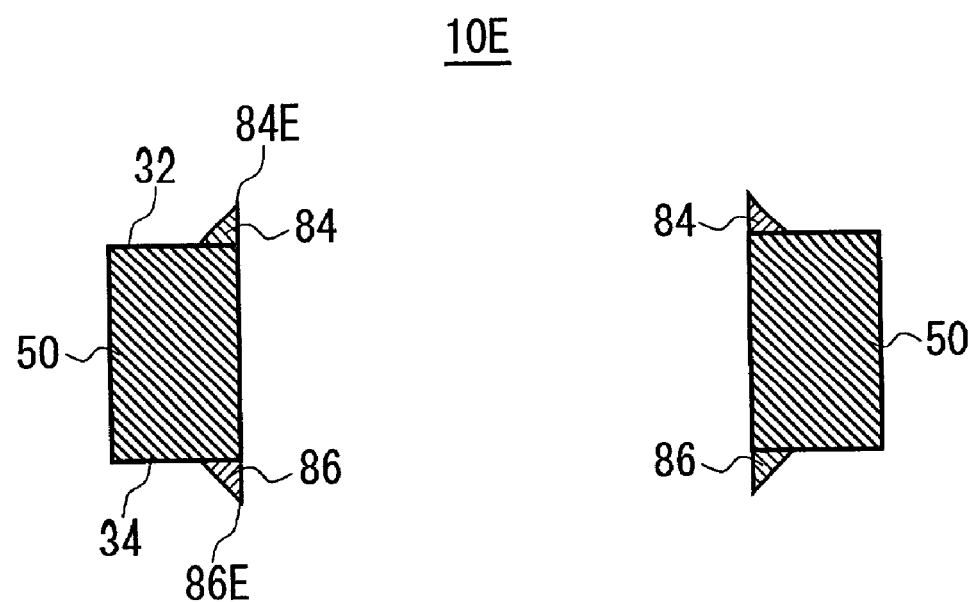
FIG. 8 shows further another embodiment of the pellicle frame of the present invention.

FIG. 8 shows further another embodiment of the pellicle frame of the present invention. The configuration of the pellicle frame 10E shown in FIG. 8 is the same as that shown in FIG. 5B except that a top end 84E of the upper protruding part 84 has a sharp edge. The upper protruding part 84 is formed all around an inner edge of the upper end 32 of the body part 50. Also, the lower protruding part 86 is formed all around an inner edge of the lower end 34 of the body part 50.

The upper protruding part 84 is not necessarily formed all around the upper end 32 of the body part 50. The upper protruding part 84 can be formed on a part of the upper end 32 of the body part 50. Also, the lower protruding part 86 is not necessarily formed all around the lower end 34 of the body part 50. The lower protruding part can be formed on a part of the lower end 34 of the body part 50.

Because the top end 84E of the upper protruding part 84 has a sharp edge, the upper protruding part 84 contacts the pellicle film 12 at one point, which is the top end 84E, along a cross sectional direction perpendicular to the longitudinal direction of the upper protruding part 84. If the top plan view of the connection between the pellicle frame 10E and the pellicle film 12 is shown, the shape of the connection is shown as a linear shape.

Thus, when the pellicle frame 10E is pushed and adhered to the pellicle film 12, the adhesive applied on the upper protruding part 84 escapes from the top end 84E of the upper protruding part 84. Therefore, the top end 84E of the upper protruding part 84 can directly and reliably contact a surface of the pellicle film 12. Thus, the vertical position of the pellicle film 12 against the pellicle frame 10E becomes constant all over the pellicle frame 10E because the pellicle frame 10E directly and reliably contacts the surface of the pellicle film 12 all over the pellicle frame 10E.

Furthermore, because the bottom end 86E of the lower protruding part 86 also has a sharp edge, the lower protruding part 86 contacts the reticle 14 at one point, which is the bottom end 86E, along a cross sectional direction perpendicular to the longitudinal direction of the lower protruding part 86. If the bottom plan view of the connection between the pellicle frame 10E and the reticle 14 is shown, the shape of the connection is shown as a linear shape.

Thus, when the pellicle frame 10E is pushed and adhered to the reticle 14, the adhesive applied on the lower protruding part 86 escapes from the bottom end 86E of the lower protruding part 86. Therefore, the bottom end 86E of the lower protruding part 86 can directly and reliably contact a surface of the reticle 14. Thus, the bottom surface of the pellicle film 12 becomes parallel to the top surface of the reticle 14. In other words, the distance between the bottom surface of the pellicle film 12 and the top surface of the reticle 14 becomes reliably constant all over the region of the pellicle film 12.

Figure 9:
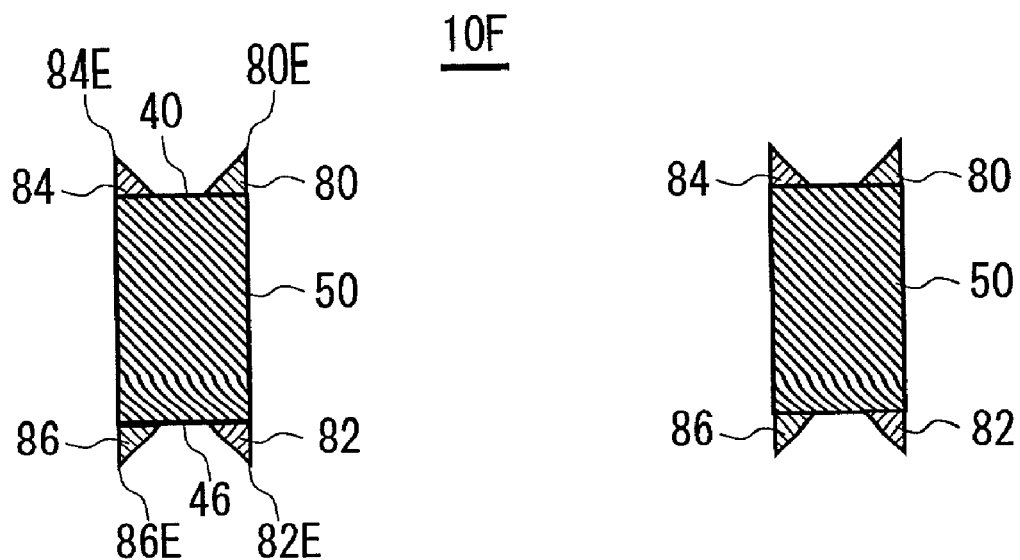
FIG. 9 shows further another embodiment of the pellicle frame of the present invention.

FIG. 9 shows further another embodiment of the pellicle frame of the present invention. The configuration of the pellicle frame 10F shown in FIG. 9 is the same as that shown in FIG. 6B except that top ends 80E and 84E of the upper protruding parts 80 and 84 have a sharp edge. The upper protruding parts 80 and 84 are formed all around both of an inner edge and an outer edge of the upper end 40 of the body part 50, respectively. Also, the lower protruding parts 82 and 86 are formed all around both of an inner edge and an outer edge of the lower end 46 of the body part 50, respectively.

The upper protruding parts 80 and 84 are not necessarily formed all around the upper end 40 of the body part 50. The upper protruding parts 80 and 84 can be formed on a part of the upper end 40 of the body part 50. Also, the lower protruding parts 82 and 86 are not necessarily formed all around the lower end 46 of the body part 50. The lower protruding parts 82 and 86 can be formed on a part of the lower end 46 of the body part 50.

Because the top end 80E of the upper protruding part 80 has a sharp edge, the upper protruding part 80 contacts the pellicle film 12 at one point, which is the top end 80E, along a cross sectional direction perpendicular to the longitudinal direction of the upper protruding part 80. Also, because the top end 84E of the upper protruding part 84 has a sharp edge, the upper protruding part 84 contacts the pellicle film 12 at one point, which is the top end 84E, along a cross sectional direction perpendicular to the longitudinal direction of the upper protruding part 84. If the top plan view of the connection between the pellicle frame 10F and the pellicle film 12 is shown, the shape of the connection is shown as two-linear shapes.

Thus, when the pellicle frame 10F is pushed and adhered to the pellicle film 12, the adhesive applied on the upper protruding parts 80 and 84 escapes from the top ends 80E and 84E of the upper protruding parts 80 and 84. Therefore, the top ends 80E and 84E of the upper protruding parts 80 and 84 can directly and reliably contact a surface of the pellicle film 12. Thus, the vertical position of the pellicle film 12 against the pellicle frame 10F becomes constant all over the pellicle frame 10F because the pellicle frame 10F directly and reliably contacts the surface of the pellicle film 12 all over the pellicle frame 10F.

Furthermore, because the bottom end 82E of the lower protruding part 82 also has a sharp edge, the lower protruding part 82 contacts the reticle 14 at one point, which is the bottom end 82E, along a cross sectional direction perpendicular to the longitudinal direction of the lower protruding part 82. Also, because the bottom end 86E of the lower protruding part 86 also has a sharp edge, the lower protruding part 86 contacts the reticle 14 at one point, which is the bottom end 86E, along a cross sectional direction perpendicular to the longitudinal direction of the lower protruding part 86. If the bottom plan view of the connection between the pellicle frame 10F and the reticle 14 is shown, the shape of the connection is shown as two-linear shapes.

Thus, when the pellicle frame 10F is pushed and adhered to the reticle 14, the adhesive applied on the lower protruding parts 82 and 86 escapes from the bottom ends 82E and 86E of the lower protruding parts 82 and 86. Therefore, the bottom ends 82E and 86E of the lower protruding parts 82 and 86 can directly and reliably contact a surface of the reticle 14. Thus, the bottom surface of the pellicle film 12 becomes parallel to the top surface of the reticle 14. In other words, the distance between the bottom surface of the pellicle film 12 and the top surface of the reticle 14 becomes reliably constant all over the region of the pellicle film 12.

Figure 10:
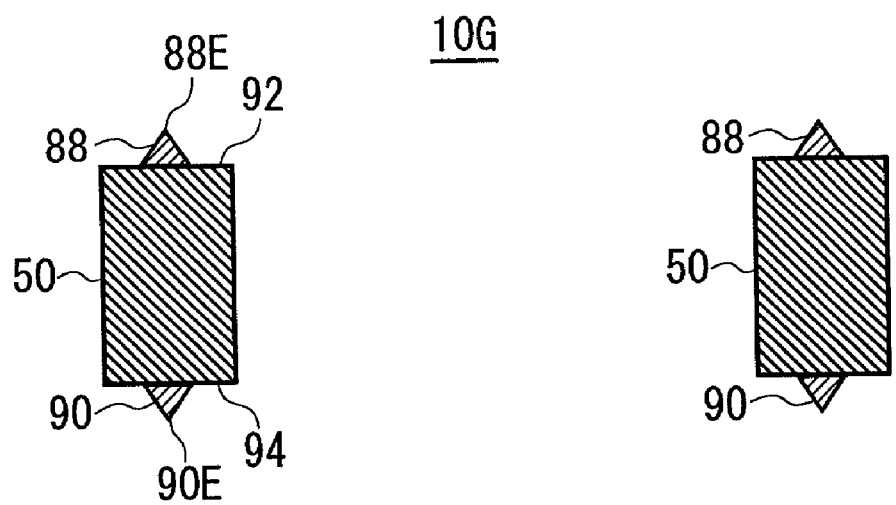
FIG. 10 shows further another embodiment of the pellicle frame of the present invention.

FIG. 10 shows further another embodiment of the pellicle frame of the present invention. The upper protruding part 88 is formed all around a central part of the upper end 92 of the body part 50. Also, the lower protruding part 90 is formed all around a central part of the lower end 94 of the body part 50.

The upper protruding part 88 is not necessarily formed all around the upper end 92 of the body part 50. The upper protruding part 88 can be formed on a part of the upper end 92 of the body part 50. Also, the lower protruding part 90 is not necessarily formed all around the lower end 94 of the body part 50. The lower protruding part 90 can be formed on a part of the lower end 94 of the body part 50.

Because the top end 88E of the upper protruding part 88 has a sharp edge, the upper protruding part 88 contacts the pellicle film 12 at one point, which is the top end 88E, along a cross sectional direction perpendicular to the longitudinal direction of the upper protruding part 88. If the top plan view of the connection between the pellicle frame 10G and the pellicle film 12 is shown, the shape of the connection is shown as a linear shape.

Thus, when the pellicle frame 10G is pushed and adhered to the pellicle film 12, the adhesive applied on the upper protruding part 88 escapes from the top end 88E of the upper protruding part 88. Therefore, the top end 88E of the upper protruding part 88 can directly and reliably contact a surface of the pellicle film 12. Thus, the vertical position of the pellicle film 12 against the pellicle frame 10G becomes constant all over the pellicle frame 10G because the pellicle frame 10G directly and reliably contacts the surface of the pellicle film 12 all over the pellicle frame 10G.

Furthermore, because the bottom end 90E of the lower protruding part 90 also has a sharp edge, the lower protruding part 90 contacts the reticle 14 at one point, which is the bottom end 90E, along a cross sectional direction perpendicular to the longitudinal direction of the lower protruding part 90. If the bottom plan view of the connection between the pellicle frame 10G and the reticle 14 is shown, the shape of the connection is shown as a linear shape.

Thus, when the pellicle frame 10G is pushed and adhered to the reticle 14, the adhesive applied on the lower protruding part 90 escapes from the bottom end 90E of the lower protruding part 90. Therefore, the bottom end 90E of the lower protruding part 90 can directly and reliably contact a surface of the reticle 14. Thus, the bottom surface of the pellicle film 12 becomes parallel to the top surface of the reticle 14. In other words, the distance between the bottom surface of the pellicle film 12 and the top surface of the reticle 14 becomes reliably constant all over the region of the pellicle film 12.

Figure 2B:
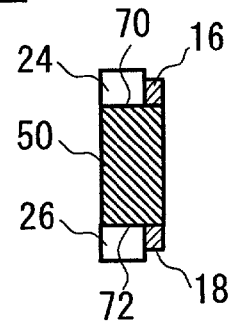
Figure 11B:
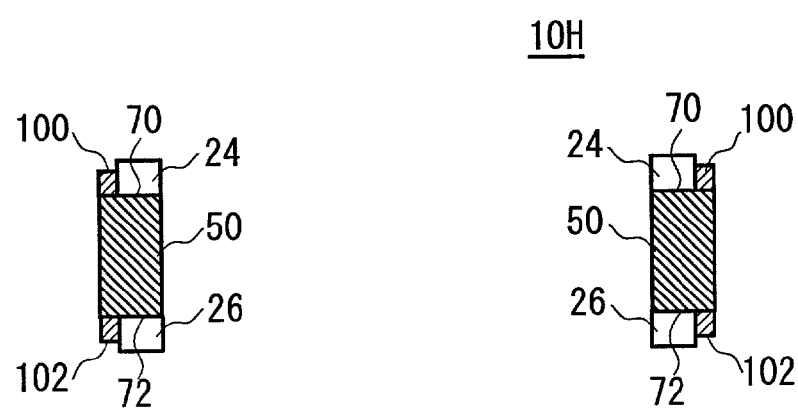

FIGS. 11A and 11B show configuration of another embodiment of the pellicle of the present invention. The configuration of the pellicle 10H shown in FIGS. 11A and 11B are the same as the configuration of FIG. 2 except the upper protruding parts 100 and lower protruding parts 102 are formed only on corners of the body part 50. As shown in FIG. 11A, the upper protruding part and lower protruding part can be formed on a part of the body part 50.

EXAMPLE 1

The pellicle frame 10A as shown in FIGS. 2A and 2B was used for manufacturing a pellicle 100A. The pellicle frame 10A was made of aluminum. The pellicle frame 10A had a rectangular plan shape as shown in FIG. 2A. The body part 50 of the pellicle frame 10A is 150 mm by 120 mm in size, 5 mm height, and 6 mm width. The upper protruding part 16 was formed all around the outer edge of the upper end 70 of the body part 50. Also, the lower protruding part 18 was formed all around the outer edge of the lower end 72 of the body part 50. Each of the upper protruding part 16 and lower protruding part 18 has 1 mm height and 3 mm width. The body part 50, the upper protruding part 16, and the lower protruding part 18 are integrally formed.

A difference between the degree of an inclination of the face formed by connecting the top ends of the upper protruding part 16 and the degree of inclination of the face formed by connecting the bottom ends of the lower protruding part 18 was measured. The difference of the degree of the inclination of the two faces was measured to measure how much the two faces were parallel to each other. The difference obtained by the measurement was 5 $\mu$m.

The adhesive 24 was applied all around the upper end 70 of the body part 50 of the pellicle frame 10A. An epoxy adhesive of "SUPER BY" manufactured by Cemedine Co., Ltd. was used for the adhesive 26. Also, the adhesive 26 was applied all around the lower end 72 of the body part 50 of the pellicle frame 10A. A silicon adhesive of "X-40-3004" manufactured by Shin-Etsu Chemical Co., Ltd. was used as the adhesive 24. At this time, the adhesive 24 was applied on the upper end 70 of the body part 50 such that the height of the adhesive 24 was slightly higher than the height of the upper protruding part 16. Furthermore, the adhesive 26 was applied on the lower end 72 of the body part 50 such that the height of the adhesive 26 was slightly higher than the height of the lower protruding part 18.

A pellicle film 12 having 1 mm thickness was adhered to the pellicle frame 10A to form a pellicle 100A. The pellicle film 12 was made of quartz glass. At this time, the upper protruding part 16 of the pellicle frame 10A directly contacted a surface of the pellicle film 12.

Then, the pellicle 100A was pressed and adhered to the reticle 14 to form a photomask 200A as shown in FIG. 3. At this time, the lower protruding part 18 of the pellicle 100A directly contacted a surface of the reticle 14.

A difference between the degree of an inclination of the pellicle film 12 and the degree of an inclination of the reticle 14 was measured. The difference between the degree of the inclination of the pellicle film 12 and that of the reticle 14 was measured to measure how much the pellicle film 12 and the reticle 14 were parallel to each other. The difference obtained by the measurement was 5 $\mu$m, which was the same difference obtained by measuring the difference between the degree of the inclination of the face formed by connecting the top ends of the upper protruding part 16 and that of the face formed by connecting the bottom ends of the lower protruding part 18.

EXAMPLE 2

The pellicle frame 10B as shown in FIGS. 5A and 5B was used for manufacturing a pellicle 100B. The pellicle frame 10B was made of aluminum. The pellicle frame 10B had a rectangular plan shape as shown in FIG. 5A. The body part 50 of the pellicle frame 10B is 150 mm by 120 mm in size, 5 mm height, and 6 mm width. The upper protruding part 28 was formed all around the inner edge of the upper end 32 of the body part 50. Also, the lower protruding part 30 was formed all around the inner edge of the lower end 34 of the body part 50. Each of the upper protruding part 28 and lower protruding part 30 has 1 mm height and 3 mm width. The body part 50, the upper protruding part 28, and the lower protruding part 30 are integrally formed.

A difference between the degree of an inclination of the face formed by connecting the top ends of the upper protruding part 28 and the degree of inclination of the face formed by connecting the bottom ends of the lower protruding part 30 was measured. The difference of the degree of the inclination of the two faces was measured to measure how much the two faces were parallel to each other. The difference obtained by the measurement was 5 µm.

The adhesive 60 was applied all around the upper end 32 of the body part 50 of the pellicle frame 10B. An epoxy adhesive of "SUPER B" manufactured by Cemedine Co., Ltd. was used for the adhesive 60. Also, the adhesive 62 was applied all around the lower end 34 of the body part 50 of the pellicle frame 10A. A silicon adhesive of "X-40-3004" manufactured by Shin-Etsu Chemical Co., Ltd. was used as the adhesive 62. At this time, the adhesive 60 was applied on the upper end 32 of the body part 50 such that the height of the adhesive 60 was slightly higher than the height of the upper protruding part 28. Furthermore, the adhesive 62 was applied on the lower end 34 of the body part 50 such that the height of the adhesive 62 was slightly higher than the height of the lower protruding part 30.

A pellicle film 12 having 1 mm thickness was adhered to the pellicle frame 10B to form a pellicle 100B. The pellicle film 12 was made of quartz glass. At this time, the upper protruding part 28 of the pellicle frame 10B directly contacted a surface of the pellicle film 12.

Then, the pellicle 100B was pressed and adhered to the reticle 14 to form a photomask 200B as shown in FIG. 5B. At this time, the lower protruding part 30 of the pellicle 100B directly contacted a surface of the reticle 14.

A difference between the degree of an inclination of the pellicle film 12 and the degree of an inclination of the reticle 14 was measured. The difference between the degree of the inclination of the pellicle film 12 and that of the reticle 14 was measured to measure how much the pellicle film 12 and the reticle 14 were parallel to each other. The difference obtained by the measurement was 5 µm, which was the same difference obtained by measuring the difference between the degree of the inclination of the face formed by connecting the top ends of the upper protruding part 28 and that of the face formed by connecting the bottom ends of the lower protruding part 30.

EXAMPLE 3

The pellicle frame 10C as shown in FIGS. 6A and 6B was used for manufacturing a pellicle 100C. The pellicle frame 10C was made of aluminum. The pellicle frame 10C had a rectangular plan shape as shown in FIG. 6A. The body part 50 of the pellicle frame 10C is 150 mm by 120 mm in size, 5 mm height, and 6 mm width. The body part 50, the upper protruding parts 16 and 28, and the lower protruding parts 18 and 30 are integrally formed.

The upper protruding parts 16 and 28 are formed all around both the inner edge and outer edge of the upper end 40 of the body part 50 so that an upper recessed part 40 is formed between the upper protruding parts 16 and 28. Also, the lower protruding parts 18 and 30 are formed all around both the inner edge and outer edge of the lower end 46 of the body part 50 so that a lower recessed part 46 is formed between the lower protruding parts 18 and 30. Each of the upper protruding parts 16 and 28 and lower protruding parts 18 and 30 has 1 mm height and 3 mm width. Furthermore, the height of the upper protruding parts 16 and 28 are the same, and the height of the lower protruding parts 18 and 30 are the same.

A difference between the degree of an inclination of the face formed by connecting the top ends of the upper protruding parts 16 and 28 and the degree of inclination of the face formed by connecting the bottom ends of the lower protruding parts 18 and 30 was measured. The difference of the degree of the inclination of two faces was measured to measure h how much the two faces were parallel to each other. The difference obtained by the measurement was 5 µm.

The adhesive 64 was applied all around the upper recessed part 40 formed by the upper protruding parts 28 and 16 of the pellicle frame 10A. An epoxy adhesive of "SUPERB " manufactured by Cemedine Co., Ltd. was used for the adhesive 64. Also, the adhesive 66 was applied all around the lower recessed part 46 formed by the lower protruding parts 18 and 30 of the pellicle frame 10A. A silicon adhesive of "X-40-3004" manufactured by Shin-Etsu Chemical Co., Ltd. was used as the adhesive 66. At this time, the adhesive 64 is applied on the recessed part 40 such that the height of the adhesive 64 was slightly higher than the height of the upper protruding parts 16 and 28. Furthermore, the adhesive 66 was applied on the lower recessed part 66 such that the height of the adhesive 66 was slightly higher than the height of the lower protruding parts 18 and 30.

A pellicle film 12 having 1 mm thickness was adhered to the pellicle frame 10C to form a pellicle 100C. The pellicle film 12 was made of quartz glass. At this time, the upper protruding parts 16 and 28 of the pellicle frame 10C directly contacted a surface of the pellicle film 12.

Then, the pellicle 100C was pressed and adhered to the reticle 14 to form a photomask 200C as shown in FIG. 6B. At this time, the lower protruding parts 18 and 30 of the pellicle 100C directly contacted a surface of the reticle 14.

A difference between the degree of an inclination of the pellicle film 12 and the degree of an inclination of the reticle 14 was measured. The difference between the degree of the inclination of the pellicle film 12 and that of the reticle 14 was measured to measure how much the pellicle film 12 and the reticle 14 were parallel to each other. The difference obtained by the measurement was 5 µm, which was the same difference obtained by measuring the difference between the degree of the inclination of the face formed by connecting the top ends of the upper protruding parts 16 and 28 and that of the face formed by connecting the bottom ends of the lower protruding parts 18 and 30.

COMPARATIVE EXAMPLE 1

Figure 1:
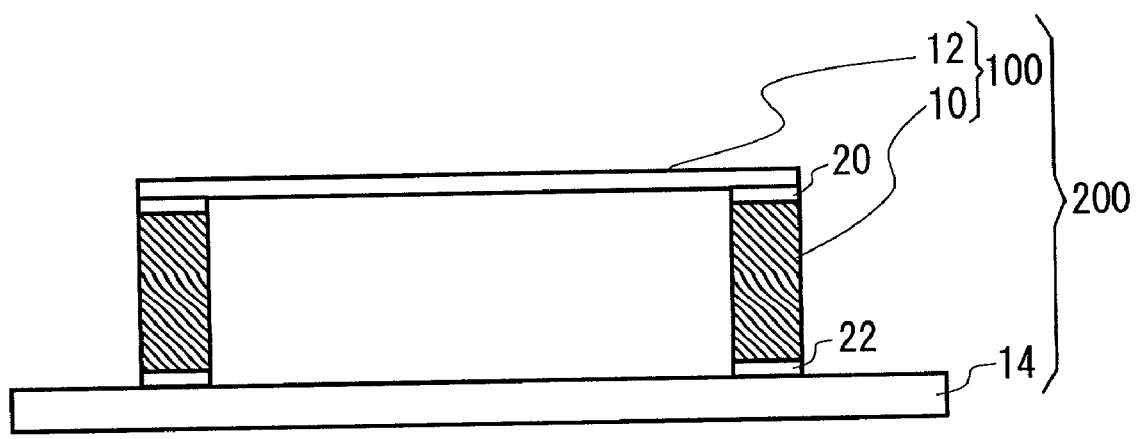
FIG. 1 shows a configuration of a conventional photomask. The photomask has a reticle 14 and a pellicle 100.

The pellicle frame 10 as shown in FIG. 1 was used for manufacturing a pellicle 100. The pellicle frame 10 was made of aluminum. The pellicle frame 10 had a rectangular plan shape. The pellicle frame 10 is 150 mm by 120 mm in size, 5 mm height, and 6 mm width. The pellicle frame 10 did not have a protruding part.

A difference between the degree of an inclination of the face formed by connecting the upper ends of the pellicle frame 10 and the degree of inclination of the face formed by connecting the lower ends of the pellicle frame 10 was measured. The difference of the degree of the inclination of two faces was measured to measure how much the two faces were parallel to each other. The difference obtained by the measurement was 5 µm.

The adhesive 20 was applied all around the upper end of the pellicle frame 10. An epoxy adhesive of "SUPER B"

manufactured by Cemedine Co., Ltd. was used for the adhesive 20. Also, the adhesive 22 was applied all around the lower end of the pellicle frame 10. A silicon adhesive of "X-40-3004" manufactured by Shin-Etsu Chemical Co., Ltd. was used as the adhesive 22.

A pellicle film 12 having 1 mm thickness was adhered to the upper end face of the pellicle frame 10 to form a pellicle 100. The pellicle film 12 was made of quartz glass. At this time, the upper end face of the pellicle frame 10 was adhered to the pellicle film 12 with the adhesive 20. Therefore, the pellicle frame 10 contacted the pellicle film 12 through the adhesive 20 and did not directly contact the pellicle film 12.

Then, the pellicle 100 was pressed and adhered to the reticle 14 to form a photomask 200 as shown in FIG. 1. At this time, the lower end face of the pellicle frame 10 was adhered to the reticle 14 with the adhesive 22. Therefore, the pellicle frame 10 contacted the reticle 14 through the adhesive 22 and did not directly contact the reticle 14.

A difference between the degree of an inclination of the pellicle film 12 and the degree of an inclination of the reticle 14 was measured. The difference between the degree of the inclination of the pellicle film 12 and that of the reticle 14 was measured to measure how much the pellicle film 12 and the reticle 14 were parallel to each other. The difference obtained by the measurement was 40 $\mu$m, which was much larger than the difference obtained by measuring the difference between the degree of the inclination of the face formed by connecting the upper ends of the pellicle frame 10 and that of the face formed by connecting the lower ends of the pellicle frame 10.

As described above, by the pellicle 10 shown in FIG. 1 and explained in the COMPARATIVE EXAMPLE, it is difficult to make the surface of the pellicle film 12 and the surface of the reticle 14 be accurately parallel to each other even if the face formed by the top ends of the upper protruding part and the face formed by the bottom ends of the lower protruding part are accurately parallel to each other because the thickness of the adhesive 20 and 22 is not uniform around the pellicle frame 10.

Contrary, the pellicle of the present embodiment can make the surface of the pellicle film 12 and the surface of the reticle 14 be accurately parallel to each other if the face formed by the top ends of the upper protruding part and the face formed by the bottom ends of the lower protruding part are accurately parallel to each other. Therefore, a photomask having high quality can be easily obtained by the present embodiment.

Although the present invention has been described by way of exemplary embodiments, it should be understood that those skilled in the art might make many changes and substitutions without departing from the spirit and the scope of the present invention which is defined only by the appended claims.

What is claimed is:

1. A pellicle for protecting a reticle, on which a circuit pattern is formed for manufacturing a semiconductor device, from an attachment of a foreign matter, comprising:
   a pellicle film;
   a pellicle frame comprising:
      a body part having a frame shape, the height of which is substantially constant; and
      an upper protruding part on an upper end of said body part that protrudes upward from said upper end of said body part and directly contacts a surface of said pellicle film, the height of said upper protruding part being constant; and
   an adhesive between the body part and the pellicle film and contacting said upper protruding part of said pellicle frame.

2. The pellicle as claimed in claim 1, wherein said upper protruding part is on an inner edge of said upper end of said body part.

3. The pellicle as claimed in claim 1, wherein said upper protruding part is on an outer edge of said upper end of said body part.

4. The pellicle as claimed in claim 1, wherein said upper protruding part comprises upper protruding parts on an inner edge and an outer edge of said upper end of said body part so that a recessed part is formed between said upper protruding parts.

5. The pellicle as claimed in claim 1, wherein said pellicle frame further comprises a lower protruding part on a lower end of said body part that protrudes downward from said lower end of said body part and directly contacts a surface of said reticle, the height of said lower protruding part being constant.

6. The pellicle as claimed in claim 5, wherein said lower protruding part is on an inner edge of said lower end of said body part.

7. The pellicle as claimed in claim 5, wherein said lower protruding part is on an outer edge of said lower end of said body part.

8. The pellicle as claimed in claim 5, wherein said lower protruding part comprises lower protruding parts on an inner edge and an outer edge of said lower end of said body part so that a recessed part is formed between said lower protruding parts.

9. The pellicle as claimed in claim 5, further comprising another adhesive between the lower end of said body part and said surface of said reticle.

10. The pellicle as claimed in claim 5, wherein a bottom end of said lower protruding part contacts said reticle at one point along a cross sectional direction perpendicular to a longitudinal direction of said lower protruding part.

11. The pellicle as claimed in claim 1, wherein said pellicle film and said pellicle frame is adhered such that said upper protruding part directly contacts a surface of said pellicle film, and an upper end of said body part contacts said surface of said pellicle film through an adhesive.

12. The pellicle as claimed in claim 1, wherein a top end of said upper protruding part comprises a sharp edge.

13. The pellicle as claimed in claim 1, wherein said upper protruding part is all around an upper end of said body part.

14. The pellicle of claim 1, wherein said pellicle film contacts a part of said upper protruding part and said adhesive, when said pellicle film is mounted on said pellicle frame.

15. A photomask comprising:
   a reticle, on which a circuit pattern is formed for manufacturing a semiconductor device;
   a pellicle for protecting said reticle from an attachment of a foreign matter; and
   an adhesive between the body part and the pellicle,
   wherein said pellicle comprises:
      a pellicle film; and
      a pellicle frame comprising
         a body part having a frame shape, the height of which is substantially constant; and
         an upper protruding part on an upper end of said body part that protrudes upward from said upper end of said body part and directly contacts a surface of said pellicle film, the height of said upper protruding part being constant, wherein said adhesive contacts said upper protruding part of said pellicle frame.

16. The photomask as claimed in claim 15, further comprising a lower protruding part on a lower end of said body part that protrudes downward from said lower end of said body part and directly contacts a surface of said reticle, the height of said lower protruding part being constant all over said lower protruding part.

17. The photomask as claimed in claim 16, wherein said upper protruding part is on an inner edge of said upper end of said body part, and said lower protruding part is on an inner edge of said lower end of said body part.

18. The photomask as claimed in claim 16, wherein said upper protruding part is on an outer edge of said upper end of said body part, and said lower protruding part is on an outer edge of said lower end of said body part.

19. The photomask as claimed in claim 16, wherein:
said upper protruding part comprises upper protruding parts on an inner edge and an outer edge of said upper end of said body part so that an upper recessed part is formed between said upper protruding parts; and
said lower protruding part comprises lower protruding parts on both an inner edge and an outer edge of said lower end of said body part so that a lower recessed part is formed between said lower protruding parts.

20. The photomask of claim 15, wherein said pellicle film contacts a part of said upper protruding part and said adhesive, when said pellicle film is mounted on said pellicle frame.

21. A pellicle frame between a reticle and a pellicle film, comprising:
a first portion directly contacting said pellicle film;
an adhesive film contacting said pellicle film; and
a second portion contacting said first portion and said adhesive film, wherein said first portion contacts said adhesive film, wherein said first portion directly contacts said reticle.

22. The pellicle frame as claimed in claim 21, further comprising another adhesive film contacting said second portion and said reticle.

23. The pellicle frame as claimed in claim 21, wherein a difference of height between said first portion and said second portion serves as an adhesive accommodation part for accommodating said adhesive film.

24. The pellicle frame of claim 21, wherein said first portion of said pellicle frame comprises an upper protruding part that contacts said pellicle film, when said pellicle film is mounted on said pellicle frame.

25. The pellicle frame of claim 21, wherein said pellicle frame is divided in a vertical direction to form said first portion and said second portion.

26. The pellicle frame of claim 21, wherein said first portion comprises:
an upper protruding part on an upper end of a body portion part; and
a lower protruding part on a lower end of a body portion part.

27. The pellicle frame of claim 26, wherein said upper protruding part contacts said pellicle film.

28. The pellicle frame of claim 26, wherein said lower protruding part contacts said reticle.

29. The pellicle frame of claim 21, wherein a height of said first portion is substantially constant and a height of said second portion is substantially constant.

* * * * *